United States Patent
Nam et al.

(10) Patent No.: US 9,446,677 B2
(45) Date of Patent: Sep. 20, 2016

(54) TECHNIQUE OF DETERMINING DEGRADATION OF HIGH-VOLTAGE BATTERY FOR VEHICLE

(75) Inventors: Ji Won Nam, Gyeonggi-do (KR); Woo Sung Kim, Gyeonggi-do (KR); Sang Mok Park, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 1113 days.

(21) Appl. No.: 13/540,874

(22) Filed: Jul. 3, 2012

(65) Prior Publication Data

US 2013/0151183 A1 Jun. 13, 2013

(30) Foreign Application Priority Data

Dec. 8, 2011 (KR) .................. 10-2011-0130852

(51) Int. Cl.
*H02J 7/00* (2006.01)
*B60L 11/18* (2006.01)
*G01R 31/36* (2006.01)

(52) U.S. Cl.
CPC ........ *B60L 11/1857* (2013.01); *G01R 31/3679* (2013.01); *H02J 7/0021* (2013.01); *Y02T 10/7005* (2013.01); *Y02T 10/705* (2013.01); *Y02T 10/7055* (2013.01)

(58) Field of Classification Search
CPC ............. G01R 31/3679; H02J 7/0021; B60L 11/1857; Y02T 10/7005; Y02T 10/7055; Y02T 10/705
See application file for complete search history.

(56) References Cited

U.S. PATENT DOCUMENTS

| 2004/0222769 A1* | 11/2004 | Al-Anbuky | ........... | H02J 7/0072 320/128 |
| 2012/0136594 A1* | 5/2012 | Tang | .................. | G01R 31/3679 702/63 |

FOREIGN PATENT DOCUMENTS

| JP | 2007-166789 A | 6/2007 |
| JP | 2010-032412 A | 2/2010 |
| JP | 2011-080811 A | 4/2011 |
| JP | 2011-133414 A | 7/2011 |
| KR | 10-2007-0051916 A | 5/2007 |
| KR | 10-2007-0076644 | 7/2007 |
| KR | 10-2007-0097623 | 10/2007 |
| KR | 10-2009-0077657 A | 7/2009 |
| KR | 10-2009-0105754 A | 10/2009 |
| KR | 10-2011-0084633 A | 7/2011 |

* cited by examiner

*Primary Examiner* — Mishchita Henson
(74) *Attorney, Agent, or Firm* — Mintz Levin Cohn Ferris Glovsky and Popeo, P.C.; Peter F. Corless

(57) ABSTRACT

Disclosed herein is a technique for determining degradation of a high-voltage battery of a vehicle. More specifically, variations in charge capacity with respect to a predetermined variation in voltage of a high-voltage battery that is currently being slowly charged are obtained depending on degradation degrees of the high-voltage battery. A vehicle equipped with a high-voltage battery having a specification identical to those of the high-voltage battery is used to acquire a charge capacity and a voltage of the high-voltage battery that is currently being slowly charged. A variation in charge capacity with respect to the predetermined variation in voltage is calculated from the charge capacity and the voltage. The variation in charge capacity with respect to the predetermined variation in voltage is compared with the variations in charge capacity with respect to the predetermined variation in voltage depending on the degradation degrees, thus determining a relevant degradation degree.

4 Claims, 3 Drawing Sheets

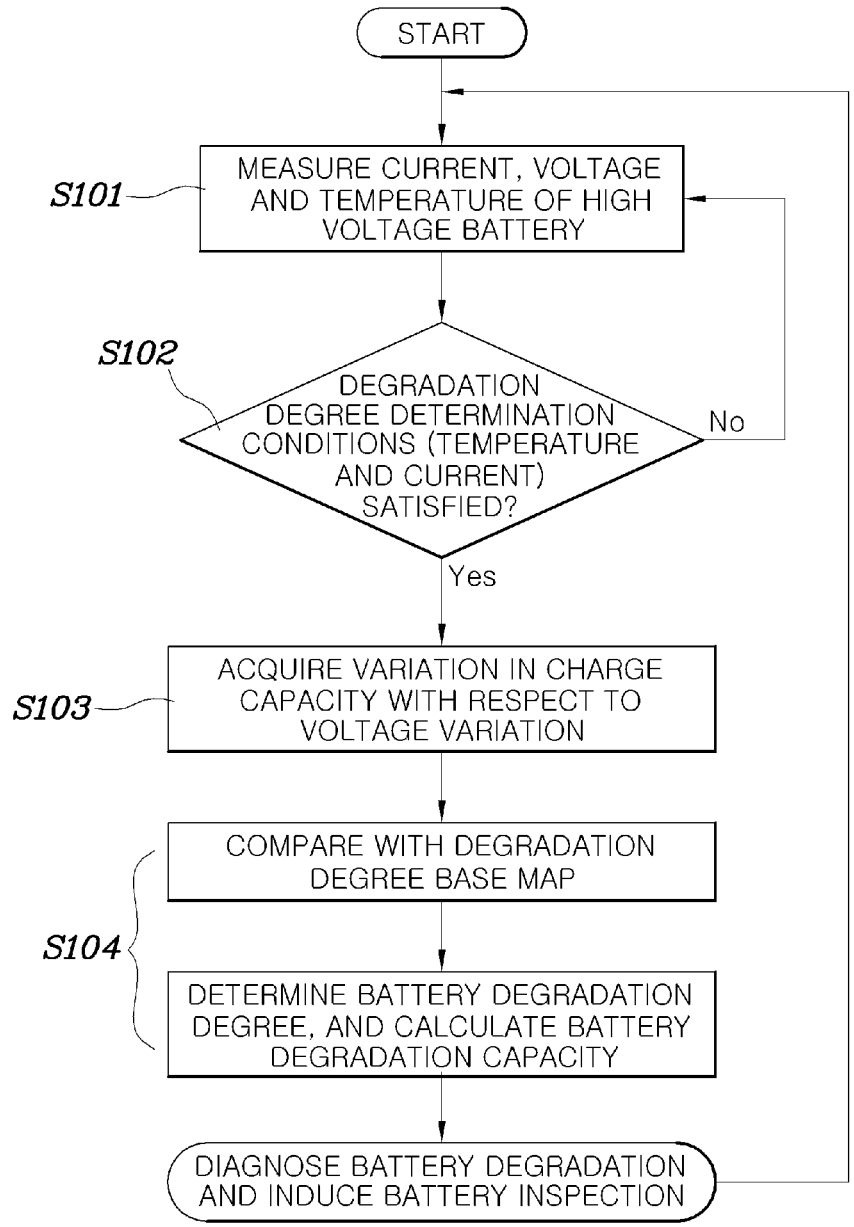

TECHNIQUE OF DETERMINING DEGRADATION OF HIGH-VOLTAGE BATTERY FOR VEHICLE

CROSS-REFERENCE TO RELATED APPLICATIONS

The present application claims priority to Korean Patent Application No. 10-2011-0130852 filed on Dec. 8, 2011, the entire contents of which is incorporated herein for purposes by this reference.

BACKGROUND OF THE INVENTION

1. Field of the Invention

The present invention relates to a technology for a method of determining the degradation of a high-voltage battery mounted in an electric vehicle, a plug-in hybrid electric vehicle, or the like.

2. Description of the Related Art

High-voltage batteries are typically mounted in an Electric Vehicle (EV), Plug-In Electric Vehicle (PHEV), or the like to store electric energy to be provided as the driving force of the vehicle. As a result, the capacity or the state of these high-voltage batteries directly influences the driving distance of a vehicle.

One known characteristic of batteries, high-voltage or not, is that when the battery is continuously used, it is realistically impossible to avoid a degradation phenomenon which reduces the storage capacity of the battery. As degradation progresses, in the driving distance of the vehicle and/or deterioration of power for acceleration, appears even if the same State Of Charge (SOC) is indicated. If such a phenomenon is not accurately detected, consumers often are unsure why over time their vehicle begins to have a shorter traveling distance, less acceleration, and/or power and thus, the dealers are unable to detect the origins of these problems because the State of Charge is inaccurate.

Unfortunately, in EV/PHEVs that are currently being developed, methods or technique capable of accurately estimating the degradation of a battery have not yet been provided.

The foregoing is intended merely to aid in the better understanding of the background of the present invention, and is not intended to mean that the present invention falls within the purview of the related art that is already known to those skilled in the art.

SUMMARY OF THE INVENTION

Accordingly, the present invention provides a technique for determining the degradation of a high-voltage battery of a vehicle, which can more accurately estimate the degradation of a high-voltage battery mounted in EV/PHEVs or the like, thus improving the accuracy of actual SOC and ensuring the stable travel state of the vehicle.

In order to accomplish the above object, at least one exemplary embodiment of the present invention provides a method of determining degradation of a high-voltage battery for a vehicle. More specifically, the method initiates by obtaining variations in charge capacity with respect to a predetermined variation in voltage of a high-voltage battery that is currently being charged (slowly), depending on degradation degrees of the high-voltage battery. Then, in a vehicle equipped with a high-voltage battery having a specification identical to those of the high-voltage battery, a charge capacity and a voltage is acquired of the high-voltage battery that is currently being charged. A variation in charge capacity with respect to the predetermined variation in voltage is calculated from the charge capacity and the voltage acquired from the vehicle. The variation in charge capacity with respect to the predetermined variation in voltage, which has been calculated), is compared with the variations in charge capacity with respect to the predetermined variation in voltage depending on the degradation degrees, which have been obtained above thus determining a relevant degradation degree for that particular battery based on its current degradation.

Further, in some exemplary embodiments of the present invention a variation in the charge capacity with respect to a predetermined variation in voltage is obtained while a high-voltage battery mounted in a vehicle is slowly charged, and is compared with data composed of variations in charge capacity with respect to a predetermined variation in voltage of a high-voltage battery having specifications identical to those of the high-voltage battery that is currently being slowly charged, depending on degradation degrees of the high-voltage battery, thus determining a relevant degradation degree.

Furthermore, the present invention provides a method of determining degradation of a high-voltage battery for a vehicle, that includes a.) measuring a current, a voltage and a temperature of a high-voltage battery mounted in a vehicle; b) determining whether the measured temperature and current of the high-voltage battery satisfies a predetermined degradation degree determination condition; c) in response to determining that the degradation degree determination conditions are satisfied, obtaining a variation in charge capacity with respect to a predetermined variation in voltage of the high-voltage battery; and d) comparing the calculated variation in charge capacity with respect to the predetermined variation in voltage with data which is constructed by measuring variations in charge capacity with respect to a predetermined variation in voltage depending on individual degradation degrees, with respect to high-voltage batteries having a specifications identical to those of the high-voltage battery, thus obtaining a degradation degree of the high-voltage battery mounted in the vehicle.

BRIEF DESCRIPTION OF THE DRAWINGS

The above and other objects, features and advantages of the present invention will be more clearly understood from the following detailed description taken in conjunction with the accompanying drawings, in which:

FIG. 4 is a flowchart illustrating an exemplary embodiment in which the illustrative embodiment of the present invention is applied to a vehicle;

DESCRIPTION OF THE PREFERRED EMBODIMENTS

Hereinafter, embodiments of the present invention will be described in detail with reference to the attached drawings.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Figure 1:
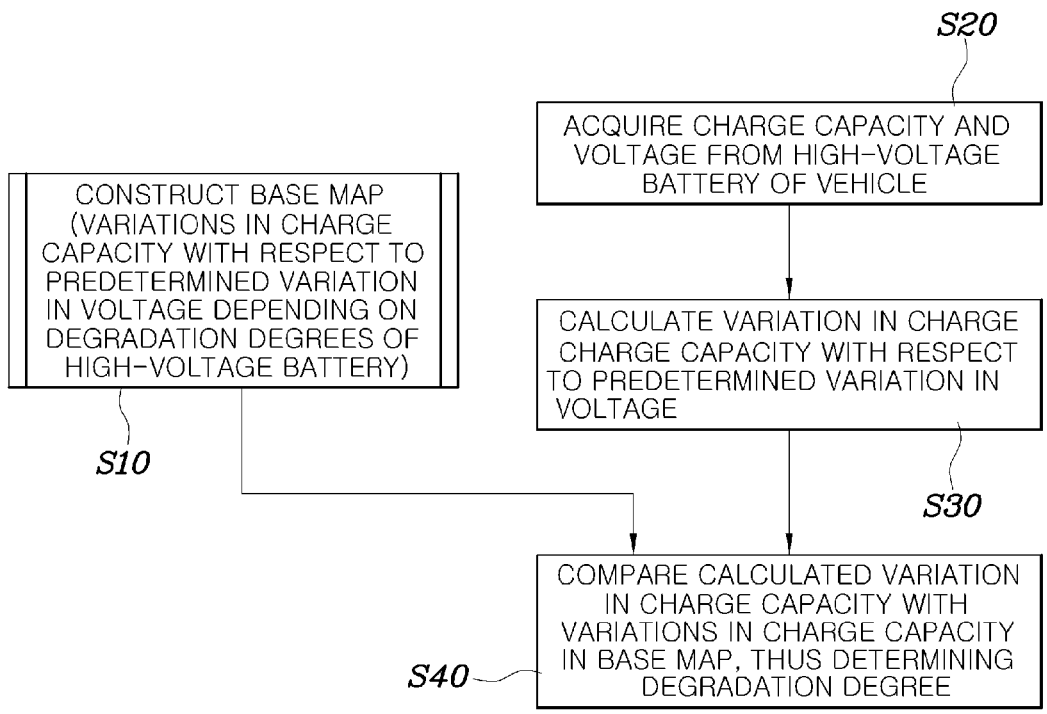
FIG. 1 is a flowchart illustrating a method of determining the degradation of a high-voltage battery for a vehicle according to an exemplary embodiment of the present invention.

Referring to FIG. 1, a method of determining, by e.g. a controller in a vehicle or a Battery Management System, the degradation of a high-voltage battery for a vehicle according to the present invention. In particular, the method includes a base map construction step S10, a data acquisition step S20, a variation calculation step S30, and a degradation degree determination step S40. The base map construction step S10 is configured to obtain variations in charge capacity with respect to a predetermined variation in the voltage of a high-voltage battery that is currently being slowly charged, depending on the degradation degrees of the high-voltage battery. The data acquisition step S20 is configured to, in a vehicle equipped with a high-voltage battery having the same specifications as the high-voltage battery, acquire the charge capacity and the voltage of the high-voltage battery that is currently being slowly charged. The variation calculation step S30 is configured to calculate a variation in charge capacity with respect to the predetermined variation in voltage from the charge capacity and the voltage that have been acquired from the vehicle through various sensors. The degradation degree determination step S40 is configured to compare the variation in charge capacity with respect to the predetermined variation in voltage, which has been calculated in the variation calculation step S30, with the variations in charge capacity with respect to the predetermined variation in voltage depending on the degradation degrees, which have been obtained in the base map construction step S10, thus determining the relevant degradation degree.

These steps in some illustrative embodiments of the present invention may be performed by one or more controllers, processors, or management system (e.g., a battery management system (BAS)) in the form of a computer program stored on a non-transitory computer readable medium. More specifically, control logic related to the computer program of the present invention may be embodied as non-transitory computer readable media on a computer readable medium containing executable program instructions executed by the processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Thus, the illustrative embodiment of the present invention is intended to obtain the variation in charge capacity with respect to the predetermined variation in voltage during slow charging of the high-voltage battery mounted in the vehicle, and compare the variation in charge capacity with respect to the predetermined variation in voltage with a base map that includes data made up of the variations in charge capacity with respect to the predetermined voltage variation depending on the degradation degrees of a high-voltage battery having the same specifications during the slow charging of the high-voltage battery to thereby determining the relevant degradation degree.

Figure 2:
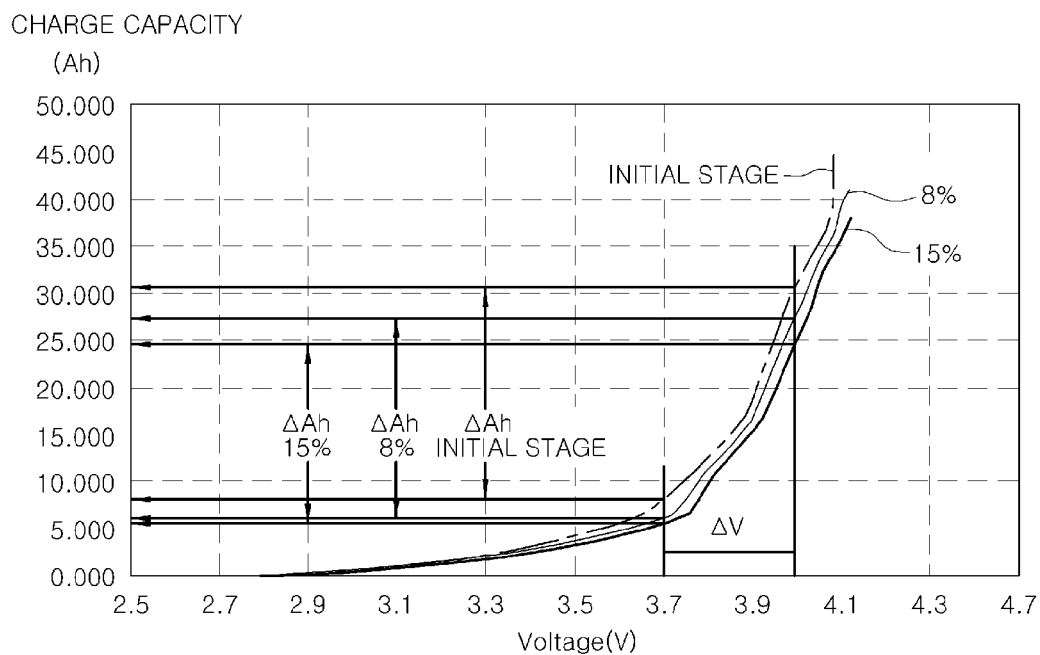
FIG. 2 is a graph illustrating variations in charge capacity with respect to a variation in voltage during the slow charging of the high-voltage battery depending on the degradation degrees of the high-voltage battery according to an exemplary embodiment of the present invention.

Referring to FIG. 2, variations in charge capacity with respect to a variation in voltage during slow charging of the high-voltage battery depending on degrees to which a high-voltage battery has degraded are shown in the form of graphs. The three curves in FIG. 2 are graphical representations of charge capacities with respect to the voltages of an initially used high-voltage battery, a high-voltage battery which has degraded by 8%, and a high-voltage battery which has degraded by 10%, respectively. It can be seen that the variations in the charge capacity exhibit different values with respect to a voltage variation from 3.7V to 4V. The present invention uses these characteristics to obtain a more accurate representation of the batteries current state of charge. That is, the term "variation in charge capacity with respect to a predetermined variation in voltage" refers to the variation in charge capacity that changes depending on the degradation degrees of individual high-voltage batteries with respect to a predetermined voltage variation from 3.7V to 4V.

In the base map construction step S10, the control unit of the illustrative embodiment of the present invention obtains the variations in the charge capacity of relevant high-voltage batteries with respect to the predetermined voltage variation that has been specified as described above while slowly charging the high-voltage batteries, degraded in different states, and stores the charge capacity variations in the form of a data map. This data map may be, for example, the following Table 1.

TABLE 1

| Degradation degree | Initial | 10% | 20% | 30% | 40% | 50% |
|---|---|---|---|---|---|---|
| Charge capacity variation | A % | B % | C % | D % | E % | F % |

In this table, A > B > C > D > E > F is satisfied.

In the base map construction step S10, the variations in charge capacity with respect to the predetermined variation in voltage depending on the degradation degrees are obtained by acquiring charge capacities and voltages using a slow charging test conducted on the high-voltage batteries which have been degraded by respective percentages, and by calculating the variations in charge capacity with respect to the predetermined voltage variation from the charge capacities and voltages.

In order to obtain the charge capacity of the high-voltage battery for a target vehicle in the data acquisition step S20, either a method of integrating charging currents flowing into the high-voltage battery and obtaining the charge capacity, or a method of converting an SOC value calculated for the high-voltage battery into charge capacity and obtaining the charge capacity may be used.

As described above, when the variation in charge capacity with respect to the predetermined voltage variation of the high-voltage battery of the measurement target vehicle is compared with the data constructed in the base map construction step S10, the relevant degradation degree can be calculated.

The base map construction step S10 and the data acquisition step S20 are performed under the conditions of a uniform temperature range and a uniform current range. Preferably, the variation in charge capacity with respect to the predetermined voltage variation of the high-voltage battery is obtained in a voltage area in which the voltage characteristics with respect to SOC are uniform regardless of the degradation degree of the high-voltage battery. That is, when the temperature of the high-voltage battery is excessively high or low, the voltage characteristics of the high-voltage battery change greatly, thus deteriorating the accuracy of measurement. Thus, it is more desirable to take these measurements only when the battery is within a certain temperature range. Furthermore, when the current is excessively low, characteristics similar to those above are exhibited as well.

Accordingly, in order to eliminate such inaccuracy, a specific temperature range and current range may be suitably selected for which accurate voltage characteristics can be obtained, through experimentation or the like.

Meanwhile, a procedure for obtaining the variation in charge capacity with respect to the predetermined voltage variation of the high-voltage battery in a voltage area in which the voltage characteristics with respect to SOC are uniform regardless of the degradation degree of the high-voltage battery will be described with reference to FIG. 3. That is, FIG. 3 is a graphical representation illustrating variations in voltage with respect to SOC of high-voltage batteries which have degraded to different degrees.

Figure 3:
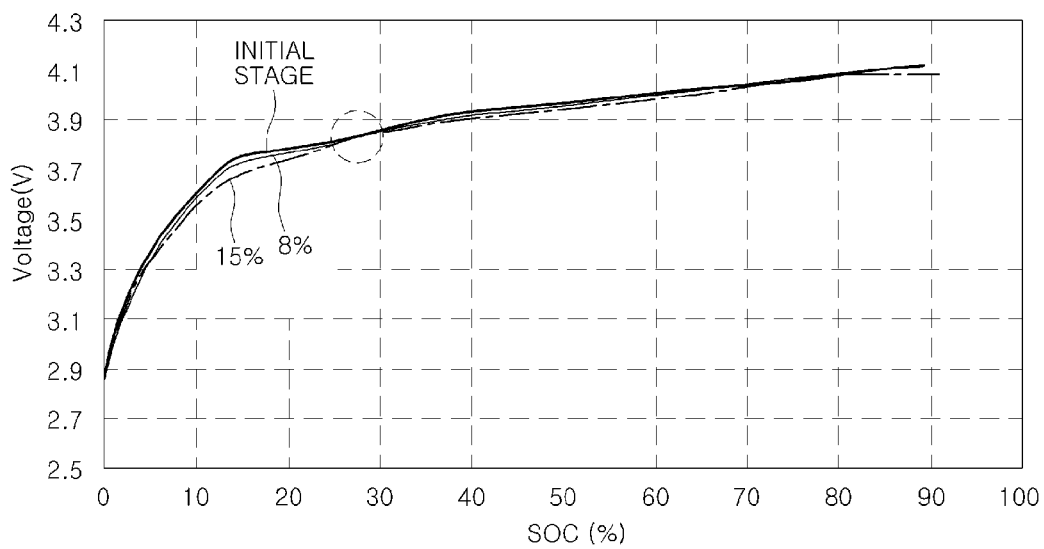
FIG. 3 is a graph illustrating variations in voltage with respect to SOC of high-voltage batteries degraded to different degrees according to the exemplary embodiment of the present invention.

In FIG. 3, when SOC ranges from about 25% to 35%, almost identical voltage characteristics are exhibited regardless of the degradation degrees of the high-voltage batteries. In the uniform voltage area ranging from 3.8V to 3.9V that is a voltage range corresponding to such an SOC range, when the variation in charge capacity with respect to the predetermined voltage variation is obtained, it is possible to more accurately compare the degradation degrees to the exclusion of the influence of SOC.

For reference, FIG. 4 is a flowchart showing an embodiment in which the technique of present invention is applied to a vehicle. An embodiment of the present invention includes first to fourth steps S101 to S104. The first step S101 is configured to measure the current, voltage and temperature of a high-voltage battery mounted in a vehicle. The second step S102 is configured to determine whether the measured temperature and current of the high-voltage battery satisfy predetermined degradation degree determination conditions. The third step S103 is configured to, if it is determined in the second step S102 that the degradation degree determination conditions are satisfied, obtain a variation in charge capacity with respect to a predetermined variation in voltage. In the fourth step S104, the variation in charge capacity with respect to the predetermined variation in voltage calculated in the third step S103 is compared with data which is constructed by measuring variations in charge capacity with respect to the predetermined variation in voltage depending on individual degradation degrees. This is done with respect to high-voltage batteries having the same specifications as the high-voltage battery, thus obtaining the degradation degree of the high-voltage battery mounted in the vehicle. Thus, the third step S103 of the illustrative embodiment of the present embodiment corresponds to the data acquisition step S20 and the variation calculation step S30, and the third step S104 corresponds to the degradation degree determination step S40.

Notably, in the third step S103 and the fourth S104, the variation in charge capacity with to respect to the predetermined variation in voltage is obtained in a voltage range in which the variation characteristics of voltage with respect to SOC are uniform regardless of the degradation degree of the high-voltage battery.

Advantageously, the illustrative embodiment of the present invention provides a more accurate state of charge of a battery by accounting for the degradation of a high-voltage battery mounted in EV/PHEVs or the like, thus ensuring the stable travel state of a vehicle.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of determining degradation of a mounted high-voltage battery in a vehicle, comprising:
   a) obtaining, by a controller in the vehicle, a plurality of variations in charge capacity with respect to a predetermined variation in voltage of a reference high-voltage battery that is currently being slowly charged, depending on degradation degrees of the reference high-voltage battery;
   b) slowly charging, by the controller, the mounted high-voltage battery;
   c) acquiring, by the controller, a charge capacity and a voltage of the mounted high-voltage battery in the vehicle that is currently being slowly charged, wherein the mounted high-voltage battery has identical specifications to the reference high-voltage battery;
   d) calculating a variation in charge capacity with respect to the predetermined variation in voltage from the charge capacity and the voltage acquired from the mounted high-voltage battery; and
   e) comparing the variation in charge capacity with respect to the predetermined variation in voltage, which has been calculated in c), with the plurality of variations in charge capacity with respect to the predetermined variation in voltage depending on the degradation degrees, which have been obtained in a) to determine a relevant degradation degree for a current state of the mounted high-voltage battery,
   wherein the plurality of variations in charge capacity with respect to the predetermined variation in voltage depending on the degradation degrees in a) are obtained by acquiring a plurality of charge capacities and voltages using a slow charting test conducted on a plurality of reference high-voltage batteries which have degraded to respective degrees,
   wherein the plurality of variations in charge capacity with respect to the predetermined variation in voltage are calculated from the plurality of charge capacities and the voltages acquired, and
   wherein the charge capacity of the mounted high-voltage batters in c) is obtained by integrating charging currents flowing into the mounted high-voltage battery.

2. The method according to claim 1, wherein:
   a) and b) are performed within a uniform temperature range and a uniform current range; and
   the variation in charge capacity with respect to the predetermined variation in voltage of the high-voltage battery is obtained in a voltage area in which voltage characteristics with respect to SOC are uniform regardless of a degradation degree of the high-voltage battery.

3. A method of determining degradation of a mounted high-voltage battery in a vehicle, comprising:
   a) obtaining, by a controller in the vehicle, a plurality of variations in charge capacity with respect to a predetermined variation in voltage of a reference high-voltage battery that is currently being slowly charged, depending on degradation degrees of the reference high-voltage battery;

b) slowly charting, by the controller, the mounted high-voltage battery;

c) acquiring, by the controller, a charge capacity and a voltage of the mounted high-voltage battery in the vehicle that is currently being slowly charged, wherein the mounted high-voltage battery has identical specifications to the reference high-voltage battery;

d) calculating a variation in charge capacity with respect to the predetermined variation in voltage from the charge capacity and the voltage acquired from the mounted high-voltage battery; and e) comparing the variation in charge capacity with respect to the predetermined variation in voltage, which has been calculated in c), with the plurality of variations in charge capacity with respect to the predetermined variation in voltage de ending on the degradation degrees, which have been obtained in a to determine a relevant degradation degree for a current state of the mounted high-voltage battery, wherein the plurality of variations in charge capacity with respect to the predetermined variation in voltage depending on the degradation degrees in a) are obtained by acquiring a plurality of charge capacities and voltages using a slow charging test conducted on a plurality of reference high-voltage batteries which have degraded to respective degrees, wherein the plurality of variations in charge capacity with respect to the predetermined variation in voltage are calculated from the plurality of charge capacities and the voltages acquired, and wherein the charge capacity of the mounted high-voltage battery in c) is obtained by converting a State Of Charge (SOC) value calculated for the mounted high-voltage battery into a charge capacity.

4. A method of determining degradation of a mounted high-voltage battery in vehicle, comprising:

a) slowly charging, by a controller, the mounted high-voltage battery;

b) measuring, by the controller, a current, a voltage and a temperature of the mounted high-voltage battery which is slowly charged;

c) determining, by the controller, whether the measured temperature and current of the mounted high-voltage battery satisfy predetermined degradation degree determination conditions;

d) in response to determining that the degradation degree determination conditions is satisfied, obtaining a variation in charge capacity with respect to a predetermined variation in voltage of the mounted high-voltage battery; and e) comparing, by the controller, the calculated variation in charge capacity with respect to the predetermined variation in voltage with data which is constructed by measuring variations in charge capacity with respect to a predetermined variation in voltage depending on individual degradation degrees, with respect to reference high-voltage batteries having a specifications identical to those of the mounted high-voltage battery, thus obtaining a degradation degree of the mounted high-voltage battery in the vehicle, wherein the variation is charge capacity with respect to the predetermined variation in voltage in d) and in e) is obtained in a voltage range in which variation characteristics of voltage with respect to State of Charge (SOC) are uniform regardless of a degradation degree of the mounted high-voltage battery and the plurality of reference high-voltage batteries.

* * * * *